May 6, 1969 B. WEIR 3,442,003

METHOD FOR INTERCONNECTING THIN FILMS

Filed July 26, 1965

INVENTOR.
BASIL WEIR

BY

ATTORNEYS

United States Patent Office 3,442,003
Patented May 6, 1969

3,442,003

METHOD FOR INTERCONNECTING THIN FILMS

Basil Weir, Palo Alto, Calif., assignor, by mesne assignments, to Teledyne, Inc., Hawthorne, Calif., a corporation of Delaware Filed July 26, 1965, Ser. No. 474,775
Int. Cl. B23k *31/02*; H01l *1/00*
U.S. Cl. 29—472.1 4 Claims

ABSTRACT OF THE DISCLOSURE

In an integrated circuit two thin film areas such as aluminum and tantalum are ohmically connected by placing a preformed metal bridge, such as gold, across the areas. Subsequent heating produces simultaneous solid diffusion of the gold bridge atoms into the tantalum and aluminum areas to form an ohmic bond.

This invention is directed to an integrated circuit and more particularly to a process for ohmically connecting two adjacent thin film areas of an integrated circuit.

With the advent of the integrated circuit and its subsequent evolution, it has been found desirable to interconnect many different types of integrated circuit components. Some of these components are inset within the body of the semiconductive substrate of the circuit itself, other components are laid in a thin film on top of the oxide layer of the substrate, and there may still be yet other configurations and types of placement. Furthermore, conductive connections between the components are also accomplished by several methods, including the use of, for example, an aluminum thin film deposited on top of an oxide layer which serves the same purpose as a conductor in an ordinary non-integrated circuit.

Because of the extremely small size of the integrated circuit, great difficulty has been experienced in the interconnection of components because of their different compositions and characteristics.

It is, therefore, a general object of this invention to provide an improved integrated circuit and process for constructing such a circuit.

It is another object of the invention to provide a process for inter-connecting two metal thin film areas of an integrated circuit.

It is yet another object to provide a method of interconnection of two thin films which is reliable and economical.

It is yet still another object of the invention to provide a method of interconnection of two thin films of dissimilar materials, and at the same time provide an external lead-in conductor.

These and other objects of the invention will become more clearly apparent from the following description when taken in conjunction with the accompanying drawings.

Referring to the drawing.

Figure 1:
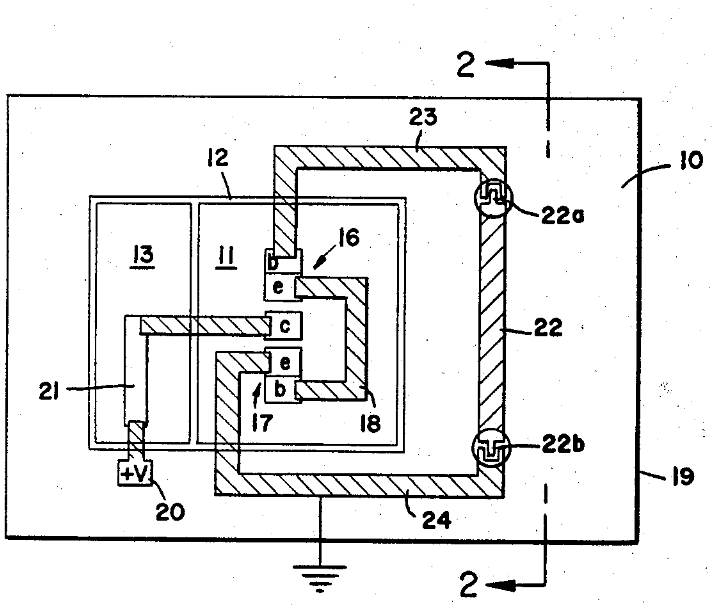
FIGURE 1 is a plan view of an integrated circuit incorporating the novel process of the invention.
Figure 3:
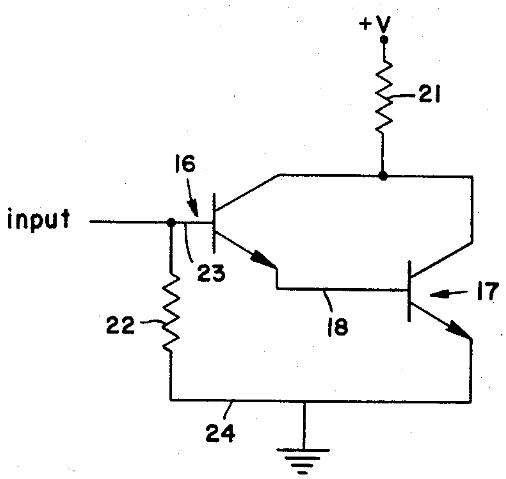
FIGURE 3 is a schematic diagram of the integrated circuit of FIGURE 1.

In the integrated circuit of FIGURE 1, which embodies the inventive process, the integrated circuit includes a semiconductive substrate wafer 10 which has on it components sufficient to produce the two stage transistor amplifier illustrated in FIGURE 3. The integrated circuit includes one island 11 which is electrically isolated from the remainder of substrate 10 by a boundary 12, and a second island 13 which is electrically isolated from the remainder of the substrate 10 by boundary 12. Inset into island 11 art two planar type transistors 16 and 17 which have emitters and bases, as indicated, and a common collector. The emitter of transistor 16 and the base of transistor 17 are interconnected by an aluminum thin film 18. All of the above structure and processes for making such structures are well known in the art and therefore will not be discussed further.

The common collector of transistors 16 and 17 is coupled to a +V voltage terminal 20 through a series connected resistor 21 which is in the form of a region of semiconductive material inset into semiconductive island 13 to form a rectifying junction therewith. This resistor provides the load or output of the transistor amplifier circuit.

Figure 2:
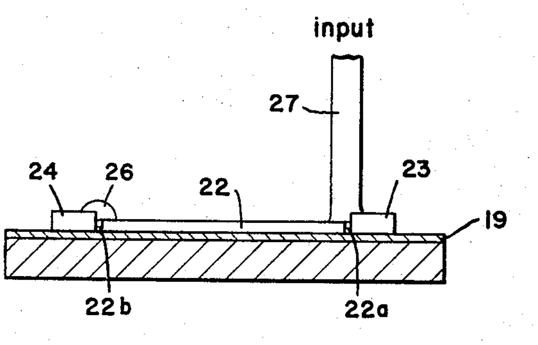
FIGURE 2 is a cross-sectional view taken along line 2—2 of FIGURE 1.

The bias resistor 22 of the circuit is provided by an anodized tantalum resistor, best shown in FIGURE 2. This resistor is carried on the oxide coating 19 of substrate 10. It is formed by photoresist methods, common in the art. The tantalum thin film is utilized in place of, for example, the inset type resistor 21 because of its more suitable electrical characteristics for use as a biasing resistor.

One end of resistor 22 has a finger **22*a*, which is placed within a bifurcated end of an aluminum thin film 23 which extends to and electrically connects with the base of transistor 16. Similarly, the other end of resistor 22 includes a finger 22*b*, which is placed within a bifurcated end of a second aluminum thin film 24 which is electrically connected to the emitter of transistor 17. Aluminum thin film 24** is also grounded in an appropriate manner.

The integrated circuit is shown schematically in FIGURE 3 with the components numbered to correspond to the actual integrated circuit components.

In accordance with the invention, a process for ohmically connecting the thin film resistor 22 with aluminum interconnecting patterns 23 and 24 comprises the following steps.

Referring to FIGURE 2, the final result of the interconnection is a metal bond which bridges between the two thin films. Initially, a metal bridge is placed across the two adjacent areas consisting of, for example, the fingers **22*a* and 22*b* of the resistor, and the bifurcated ends of the aluminum thin film 23 and 24. This metal bond may consist of a gold wire which is placed over the adjacent areas. This wire is then heated to such a temperature to allow atoms of its metal to diffuse with atoms of the metals of the two thin film areas. The temperatures, of course, must be compatible with the integrated circuit itself, the substrate, and, in addition, high enough to allow solid diffusion of the metal bond atoms into the thin metal films to provide the necessary bond or weld and yet low enough to prevent melting of any of the metals whereby melting and alloying might result. Alternatively, a thermocompression method may be used for the welding procedure where a combination of pressure and temperature produces the solid diffusion. After the solid diffusion has occured to the desired extent, the wire may be removed leaving a body of metal 26 as shown in FIGURE 2 which forms an ohmic interconnection between the two thin films 22 and 24; or the wire bridge may remain, as shown by wire 27**, to be used as an external electrical lead-in for the integrated circuit.

The deposited metal in conjunction with the thin film areas forms a unitary structure to produce an ideal connection therebetween. The use of the metal bridge technique effectively overcomes the incompatibility of the aluminum and tantalum metal, or other dissimilar types of metals, including variations in their thickness, as illustrated in FIGURE 2, temperature coefficients, and the fact that because of the different metal compositions different oxide layers form on the respective thin films preventing effective electrical connection between the two, if connection is made by a simple overlap. Moreover, the novel method is also applicable to connecting metals of the same general kind but of dissimilar types; for example, transistor aluminum which has been alloyed, and unalloyed thin film aluminum conductors. The method itself is economical and simple in technique, and offers a reliable method of connection. In addition, the use of the metal bridging wire as an external lead also increases the attractiveness of the process.

I claim:

1. A process for ohmically connecting two adjacent dissimilar thin film areas of an integrated circuit, such thin films being composed substantially of tantalum and aluminum respectively comprising the following steps: placing a preformed metal bridge composed substantially of gold across such areas, and causing by heating simultaneous solid diffusion of said bridge atoms into the metals of said two areas to form an ohmic bond between said thin films.

2. A process as in claim 1 where said tantalum thin film area is a resistor and said aluminum thin film area serves as an ohmic connection to an active component of said integrated circuit.

3. A process as in claim 1 where said bridge also serves as an external electrical lead for said integrated circuit.

4. A process as in claim 1 in which said bridge is a cylindrical wire.

References Cited

UNITED STATES PATENTS

| | | | |
|---|---|---|---|
| 2,381,819 | 8/1945 | Graves et al. | 29—573 X |
| 3,006,067 | 10/1961 | Anderson et al. | 29—470 |
| 3,138,744 | 6/1964 | Kilby | 317—101 |
| 3,256,587 | 6/1966 | Hangstefer | 29—577 |
| 3,258,898 | 7/1966 | Garibotti | 29—577 |
| 3,310,858 | 3/1967 | Johnston | 29—590 |
| 3,274,667 | 9/1966 | Siebertz | 29—589 X |

WILLIAM J. BROOKS, *Primary Examiner.*

U.S. Cl. X.R.

29—498, 504, 577, 589, 625